US009551936B2

(12) United States Patent
Kehren et al.

(10) Patent No.: US 9,551,936 B2
(45) Date of Patent: Jan. 24, 2017

(54) PERFLUOROALKYL SULFONAMIDES SURFACTANTS FOR PHOTORESIST RINSE SOLUTIONS

(75) Inventors: Jason M. Kehren, Stillwater, MN (US); Patricia M. Savu, Maplewood, MN (US); Matthew J. Pinnow, Milwood, NY (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 33 days.

(21) Appl. No.: 14/237,193

(22) PCT Filed: Aug. 1, 2012

(86) PCT No.: PCT/US2012/049158
§ 371 (c)(1),
(2), (4) Date: Feb. 5, 2014

(87) PCT Pub. No.: WO2013/022673
PCT Pub. Date: Feb. 14, 2013

(65) Prior Publication Data
US 2014/0154632 A1    Jun. 5, 2014

Related U.S. Application Data

(60) Provisional application No. 61/522,057, filed on Aug. 10, 2011.

(51) Int. Cl.
*G03F 7/32* (2006.01)
*G03F 7/40* (2006.01)
*H01L 21/027* (2006.01)

(52) U.S. Cl.
CPC ............... *G03F 7/40* (2013.01); *G03F 7/405* (2013.01); *H01L 21/0273* (2013.01)

(58) Field of Classification Search
CPC .............................. G03F 7/322; G03F 7/405
USPC ................................................ 430/329, 331
See application file for complete search history.

(56) References Cited

U.S. PATENT DOCUMENTS

| 2,567,011 | A |  | 9/1951 | Diesslin et al. |
| 3,734,962 | A |  | 5/1973 | Niederprüm et al. |
| 4,089,804 | A |  | 5/1978 | Falk |
| 4,370,254 | A |  | 1/1983 | Mitschke et al. |
| 6,509,133 | B1 | * | 1/2003 | Watanabe et al. .......... 430/270.1 |
| 6,890,452 | B2 |  | 5/2005 | Parent et al. |
| 7,169,323 | B2 |  | 1/2007 | Parent et al. |
| 7,662,896 | B2 | * | 2/2010 | Savu .................. B01F 17/0035 526/243 |
| 7,741,260 | B2 |  | 6/2010 | Koshiyama et al. |
| 2004/0029395 | A1 |  | 2/2004 | Zhang et al. |
| 2004/0089840 | A1 |  | 5/2004 | Parent et al. |
| 2005/0148491 | A1 |  | 7/2005 | Savu et al. |
| 2008/0280230 | A1 |  | 11/2008 | Chang et al. |
| 2008/0299487 | A1 |  | 12/2008 | Chang |
| 2009/0208870 | A1 | * | 8/2009 | Ozaki .................. B41C 1/1008 430/284.1 |
| 2010/0155657 | A1 |  | 6/2010 | Savu |
| 2010/0160458 | A1 |  | 6/2010 | Savu et al. |

FOREIGN PATENT DOCUMENTS

| JP | H05251416 | 9/1993 |
| JP | 2007-213013 | 8/2007 |
| JP | 2007-219009 | 8/2007 |
| JP | 2010-256849 | 11/2010 |
| WO | WO 01-30873 | 5/2001 |

OTHER PUBLICATIONS

Cao, H. et al., "Comparison of resist collapse properties for deep ultraviolet and 193 nm resist platforms", Journal of Vacuum Science & Technology B, vol. 18; 2000, vol. 18; pp. 3303-3307.
Domke, W. et al., "Pattern Collapse in High Aspect Ratio DUV- and 193nm Resists", Proceedings of SPIE, vol. 3999; 2000, pp. 313-321.
Drechsler, A. et al., "The Effect of Absorbed Cationic Surfactant on the Pattern Collapse of Photoresist Lines in Photolithographic Processes"; Progress in Colloid Polymer Science; vol. 132; 2006, pp. 82-94.
Lin, E. et al.; "Direct Measurement of the Reaction Front in Chemically Amplified Photoresists" Science; vol. 297; 2002, pp. 372-375.
Miyahara, O. et al., "Improvement of pattern collapse issue by additive added D.I water rinse process 2", Proceedings of SPIE, vol. 5376; 2004, pp. 830-841.
Pret, A. et al.; "Roughness characterization in the frequency domain and linewidth roughness mitigation with post-lithography process", Journal of Micro/Nanolithography, MEMS and MOEMS; vol. 9, No. 4; 2010, pp. 041203-1 to 041203-7.
Tanaka, T. et al, "Mechanism of Resist Pattern Collapse during Development Process", Japanese Journal of Applied Physics, vol. 32; 1993, pp. 6059-6064.
Tanaka, K. et al.; "Improvement of pattern collapse issue by additive added D.I water rinse process"; Proceedings of SPIE, vol. 5039; 2003, pp. 1366-1381.
Wallraff, G.M. et al., "Lithographic Imaging Techniques for the Formation of Nanoscopic Features", Chemical Reviews, vol. 99, No. 7; 1999; pp. 1801-1821.
Zhang, P. et al., "Combined Pattern Collapse and LWR Control at the 70 nm Node through Application of Novel Surface Conditioner Solutions", Proceedings of SPIE, vol. 5753; 2005, pp. 1018-1023.
Zhang, P. et al., "Post-Etch LERPerformance of Novel Surface Conditioner Solutions" Proceedings of SPIE, vol. 6153; 2006, pp. 61533Y.1-61533Y.5.

* cited by examiner

Primary Examiner — Daborah Chacko Davis
(74) Attorney, Agent, or Firm — Adam Bramwell

(57) ABSTRACT

A method of modifying a surface of a photoresist material including exposing the photoresist material to an aqueous ionic surfactant solution and varying the pH of the aqueous ionic surfactant solution until a fluorochemical layer is formed in or on the photoresist material. The aqueous ionic surfactant solution includes a perfluoroalkyl sulfonamide the formula: $R_fSO_2NH-R'$ where $R_f=C_nF_{2n+1}-$ and n=1 to 6, R'=—H, —$CH_3$, and —$CH_2CH_2OH$. The aqueous ionic surfactant solution has a pH of within about 3 pH units of a pKa of the perfluoroalkyl sulfonamide.

12 Claims, No Drawings

PERFLUOROALKYL SULFONAMIDES SURFACTANTS FOR PHOTORESIST RINSE SOLUTIONS

CROSS REFERENCE TO RELATED APPLICATIONS

This application claims priority from U.S. Provisional Application Ser. No. 61/522,057, filed Aug. 10, 2011, the disclosure of which is incorporated by reference in its/their entirety herein.

TECHNICAL FIELD

The present invention is related generally to perfluoroalkyl sulfonamide surfactants. In particular, the present invention is a method of controlling the modification of a photoresist surface by varying the pH of an aqueous perfluoroalkyl sulfonamide solution.

BACKGROUND

An integrated circuit consists of series of patterned functional layers (insulators, metal wires, etc). The structure of each layer is transferred from a mask via photolithography followed by etching or ion implantation. In the photolithographic process, the functional layer is covered by a photoresist film. The circuit patterns are fabricated with a chemically amplified photoresist consisting of a polymer with an acid-labile pendant protecting group, photoacid generator (PAG), and additional additives. Upon exposure to UV radiation through a patterned mask, the PAG is decomposed, generating a low concentration of acid. In the post-exposure bake, the acid diffuses and catalyzes a deprotection reaction that cleaves a pendant group of the insoluble polymer resulting in formation of a polymer that is soluble in the developer solution.

The exposed regions of the positive tone photoresist are removed by dissolution in a developer solution, generally using solutions including tetramethyl ammonium hydroxide in water, leaving a pattern of unexposed photoresist lines. To fulfill the demands for minimizing the feature size, the width of the photoresist structures must shrink adequately. Their heights cannot be reduced in the same way since etch resistance must be retained. With increasing aspect ratio, the mechanical strength of the photoresist lines decreases, leading to collapse of the structures during the development process. This pattern collapse is caused by unbalanced capillary forces acting between the lines after development and during the drying steps.

There have been a number of approaches developed to achieve reduction in feature size while preventing pattern collapse. The key parameters of the rinse fluid for preventing pattern collapse are the surface tension of the rinse fluid and the contact angle of the rinse fluid on the photoresist. (Tanaka, T.; Morigami, M.; Atoda, N.; (1993) *Jpn. J. Appl. Phys.*; Vol 32; pg 6059-6064). A promising approach to controlling surface tension and contact angle during the rinse step is to incorporate surfactant solutions in the development and/or rinse steps of the photolithographic process. The addition of a surfactant to the rinse liquid has been shown to reduce pattern collapse in several studies. Additional benefits include reducing defects and reducing line edge roughness (LER) and line width roughness (LWR). Surfactant rinses have been used to control the contact angle of aqueous fluids on the photoresist (U.S. Pat. No. 7,741,260) and reduce water marks (U.S. Patent Application Publication Nos. 2008/0280230 and 2008/0299487).

Several studies have discussed the importance of the adsorption of the surfactant on the photoresist surface (Tanaka, K., et al; (2003); *Proc. of SPIE* 5039, pp 1366-1381). Specifically, the use of a surface conditioning solution that interacts with the resist surface to smooth out the profile has also been discussed (Zhang, P. et al; (2006); *Proc. of SPIE* 6153; 61533Y). These studies demonstrate that the interaction of the surfactant with the photoresist, through adsorption of the surfactant onto or into the photoresist, is key for the reduction of LER, water defects and potentially for the other benefits of surfactant rinses.

However, high hydrocarbon surfactant concentrations may melt the photoresist and amplify pattern collapse (Watanbe, M.; Tomo, Y.; Yamabe, M.; Kiba, Y.; Tanaka, K.; Wakakizu, S; Kitano, J.; Yamada, Y.; (2004) *Proc SPIE* 5376:830). Additionally, the effect of a surfactant rinse is dependent on the photoresist (Pret, A. V; Gronheid, R.; Foubert, P.; (2010) *J. Micro/Nanolith.* MEMS and MOEMS; Vol 9; 041203). The addition of surfactants to the rinse liquid has many potential benefits, but identifying the optimal surfactant for a particular photoresist can be a complicated process. Other than surfactant concentration, the known candidates do not offer any process handle for tuning the surfactant interaction with the photoresist.

Furthermore, the surfactants in question must be sufficiently soluble in the rinse solution (e.g., water) to fully dissolve otherwise unwanted defects might be introduced onto the surface of the photoresist.

SUMMARY

In one embodiment, the present invention is a method of modifying a surface of a photoresist material. The method includes exposing the photoresist material to an aqueous ionic surfactant solution and varying the pH of the aqueous ionic surfactant solution until a fluorochemical layer is formed in or on the photoresist material. The aqueous ionic surfactant solution includes a perfluoroalkyl sulfonamide the formula: $R_fSO_2NH-R'$ where $R_f=C_nF_{2n+1}-$ and n=1 to 6, R'=—H, —CH$_3$, and —CH$_2$CH$_2$OH. The aqueous ionic surfactant solution has a pH of within about 3 pH units of a pKa of the perfluoroalkyl sulfonamide.

DETAILED DESCRIPTION

The present invention describes a method of modifying a surface of a photoresist material by contacting the surface of the photoresist material with an aqueous ionic surfactant solution, for example, an aqueous perfluoroalkyl sulfonamide solution, and varying the pH of the aqueous ionic surfactant solution to obtain a desired result. Surface modification is achieved through adsorption of the surfactant onto or into the photoresist surface layer and the level of adsorption is pH dependent. In one embodiment, the aqueous ionic surfactant solution is an ionic surfactant rinse solution. The aqueous ionic surfactant solution has tunable interaction with the photoresist material and allows tailoring as needed depending on the photoresist material and semiconductor manufacturing requirements.

In one embodiment, the aqueous ionic surfactant solution is an aqueous perfluoroalkyl sulfonamide solution of Formula I.

$$R_fSO_2NH-R' \tag{I}$$

where $R_f=C_nF_{2n+1}-$ and n=1 to 6, and R'=—H, —CH$_3$,  and —CH$_2$CH$_2$OH.

Higher homologs where R' is a hydrocarbon alkyl group including greater than 2 carbon atoms, such as —C$_3$H$_7$, do not have sufficient solubility in the rinse solution over a wide pH range to be useful in imparting a defect free adsorbed fluorochemical layer onto the surface of the photo resist using the pH adjustment method of the present invention.

In one embodiment, the aqueous perfluoroalkyl sulfonamide solution has a concentration of between about 10 ppm and about 10,000 ppm and particularly between about 50 ppm and about 5000 ppm. In one embodiment, the aqueous perfluoroalkyl sulfonamide solution has a pH within about 3 pH units of the pKa of the perfluoroalkyl sulfonamide and particularly within about 2 pH units of the pKa of the perfluoroalkyl sulfonamide. For example, if the pKa of the perfluoroalkyl sulfonamide is 6.5, the pH range of the aqueous perfluoroalkyl sulfonamide solution would be between about 3.5 and about 9.5. In one embodiment, the aqueous perfluoroalkyl sulfonamide solution has a neutral sulfonamide to sulfonamide salt ratio of about 99.9:0.1 to 0.1:99.9 and particularly about 99:1 to 1:99. Examples of suitable aqueous perfluoroalkyl sulfonamide solutions include, but are not limited to, $C_4F_9SO_2N(H)CH_2CH_2OH$ (N-HFBSE), $C_4F_9SO_2N(H)CH_3$ (N-MeFBSA) and $C_4F_9SO_2NH_2$ (N-HFBSA) in dilute aqueous ammonia. Although the remainder of the specification describes the aqueous ionic surfactant solution as an aqueous perfluoroalkyl sulfonamide solution, the aqueous ionic surfactant solution may include any ionic surfactant without departing from the intended scope of the present invention.

The surface of the photoresist material is modified by controlling the level of adsorption of the aqueous perfluoroalkyl sulfonamide solution onto the surface of the photoresist material. In one embodiment, the photoresist material is a patterned photoresist. Both the surface tension and adsorption of the aqueous perfluoroalkyl sulfonamide solution into or onto a photoresist material can be controlled by altering the pH of the aqueous perfluoroalkyl sulfonamide solution in water. By decreasing the pH of the solution, the surface tension is reduced significantly as the ratio of perfluoralkyl sulfonamide to perfluoroalkyl sulfonamide salt increases. For the N-HFBSE and N-HFBSA, the surface tension decreases linearly above the pKa as the pH decreases. Surface tension can be measured, for example, using a Krüss K12 tensiometer using a plate method.

Surface modification of, or adsorption to, the photoresist material can be determined by measuring the mass change of the photoresist material. The mass change can be measured, for example, using a Q-Sense E4 QCM-D (quartz crystal microbalance—dissipative). The QCM-D measures frequency shift, which is proportional to the mass adsorbance of the aqueous perfluoroalkyl sulfonamide solution on the photoresist material. An increased (negative) frequency shift measured by QCM-D indicates increasing mass adsorbance, which is observed as the pH of the aqueous perfluoroalkyl sulfonamide solution is decreased.

One method of preparing the aqueous perfluoroalkyl sulfonamide solution involves first adding aqueous ammonia to water to form a solution. One example of a commercially suitable ammonia includes, but is not limited to, product number 3265-45, 28-30% ammonia in water, available from Mallinkrodt Chemicals. In one embodiment, the water is 18.2 MSΩ water. Molten perfluoroalkyl sulfonamide is then charged to the solution to make an aqueous perfluoroalkyl sulfonamide solution. The solutions are mixed for about one hour and allowed to settle overnight. The solution is then filtered to remove insoluble material and particles. In one embodiment, the filter membrane is polytetrafluoroethylene (PTFE), polyethylene (PE), polyether sulfone (PES) or glass fiber. In one embodiment, the filter is at least a 1 um rating and particularly at least a 0.2 μm rating.

The surface of the photoresist material is modified, for example, in a lithography process, by first exposing the photoresist material to an aqueous perfluoroalkyl sulfonamide solution. In one embodiment, the photoresist material is rinsed with deionized (DI) water rinse prior to exposing the photoresist material to the aqueous perfluoroalkyl sulfonamide solution rinse. In another embodiment, the photoresist material is rinsed with DI water rinse subsequent to exposing the photoresist material to the aqueous perfluoroalkyl sulfonamide solution.

The pH of the aqueous perfluoroalkyl sulfonamide solution may be varied until a fluorochemical layer is formed on the photoresist material. The pH may also be varied until the LER or LWR of the patterned photoresist material has been reduced by at least about 10% and particularly by at least about 25%. The pH may also be varied until the amount of water defects on the photoresist material has been reduced by at least about 25% and particularly by at least about 50%. In all cases, the photoresist material must be monitored to ensure that melting, deformity or other defects on the patterned surface have not occurred. Imaging data can be performed on the surface of the patterned photoresist material (e.g., by SEM) to measure various parameters critical to photoresist performance, such as whether there has been formation of any deformities or water mark or particle defects or any melting of features or pattern collapse. The impact of the surfactant rinse on process window, critical line dimensions (CD), LER and LWR can be determined as well.

After the photoresist material has been modified as desired, the photoresist material is dried to remove the aqueous perfluoroalkyl sulfonamide solution from the surface of the photoresist material. In one embodiment, the photoresist material is dried by spin drying. After exposure to the aqueous solution of the perfluoroalkyl sulfonamide at controlled pH, the drying time of the photoresist material pH may be reduced by at least about 10% and particularly by at least about 25%.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following example are on a weight basis.

Surface tensions for these solutions were measured with a Krüss K12 tensiometer (available from Kreuss Optronics, Hamburg, Germany) using a plate method.

The adsorption of the surfactant to a photoresist material (EPIC 2135 193 nm photoresist available from Dow Chemical Co., Midland, Mich.) was measured using a Q-Sense E4 QCM-D microbalance (available from Bolin Scientific, Västra Frölunda, SWEDEN). This instrument analyzes both the dissipation and frequency shift of a quartz crystal sensor to characterize thin films coated on the sensor. This allows the mass of material adsorbed onto the thin film and the viscoelastic properties of the thin film to be measured. In particular, it allows measurement of the mass adsorbed onto the photoresist material during exposure to the surfactant solution.

A gold plated quartz crystal sensor (QSX 301, Biolin Scientific, Sweden) was single side coated with photoresist (EPIC 2135 193 nm) by spin coating. One to three droplets of the resist material were applied to a clean sensor. The sensor was then spun at 1500 rpm for 27 seconds. The resist was baked by placing the sensor on a hot plate at 120° C. for 60 seconds.

The coated sensors were then tested in three stages. During all stages, dissipation and frequency shift were monitored on multiple bands. In the first phase, 18 megaohm water was run over the sensor for four to five minutes to establish a baseline. No frequency shift or dissipation was observed during this stage. Once the baseline was established, the second stage was started by changing the flow to the surfactant solution (150 μL/minute). This flow was continued until the frequency shift and dissipation stabilized (10 to 15 minutes). Reported values for frequency shift were measured at this time. In the third stage, the flow was shifted back to 18 megaohm water. The shift in frequency and dissipation were again monitored for 5 to 10 minutes to determine if the adsorbance was reversible.

Example 1

$C_4F_9SO_2N(H)CH_2CH_2OH$ with Ammonium Hydroxide $C_4F_9SO_2N(H)CH_2CH_2OH$ (N-HFBSE) was prepared according to Example 9 in U.S. Pat. No. 3,734,962. 25% solutions of N-HFBSE were prepared by dissolving molten N-HFBSE in aqueous ammonia (29% ammonia in water available from Mallinkrodt Chemicals, St. Louis, Mo.) which had been diluted with 18.2 megaohm water. The solutions were mixed for one hour, allowed to settle overnight and then filtered through a 0.2 μm polytetrafluoroethylene (PTFE) syringe filter. Examples 1-7 were prepared according to Table 1 below.

TABLE 1

Sample Preparation of N-HFBSE/NH$_4$OH

| Example | Wt % NH$_4$OH | Mass Water (g) | Mass 29% NH$_3$ (g) | Mass N-HFBSE (g) |
|---|---|---|---|---|
| 1 | 1.0% NH$_4$OH | 14.66 | 0.34 | 5.01 |
| 2 | 1.5% NH$_4$OH | 14.49 | 0.53 | 5.04 |
| 3 | 2.0% NH$_4$OH | 14.32 | 0.70 | 5.01 |
| 4 | 2.5% NH$_4$OH | 14.13 | 0.86 | 5.01 |
| 5 | 3.0% NH$_4$OH | 13.97 | 1.02 | 5.08 |
| 6 | 4.0% NH$_4$OH | 13.62 | 1.39 | 4.99 |
| 7 | 5.0% NH$_4$OH | 13.28 | 1.73 | 5.02 |

These solutions were further diluted with water to 2500 ppm surfactant (N-HFBSE) for surface tension and adsorption testing.

The surface tension and steady state frequency shift adsorbance of the N-HFBSE of Examples 1-7 during surfactant solution flow were recorded in Table 2 below.

TABLE 2

N-HFBSE/NH$_4$OH at 2500 ppm

| Example | Sample | pH | Surface Tension dyn/cm | Frequency Shift |
|---|---|---|---|---|
| 1 | 1.0% NH$_4$OH | 6.8 | 19.6 | 13 |
| 2 | 1.5% NH$_4$OH | 7.3 | 23.6 | 8 |
| 3 | 2.0% NH$_4$OH | 7.7 | 29.7 | 5 |
| 4 | 2.5% NH$_4$OH | 8.2 | 37.1 | 2 |
| 5 | 3.0% NH$_4$OH | 8.7 | 48.8 | 0 |
| 6 | 4.0% NH$_4$OH | 9.2 | 53.0 | 0 |
| 7 | 5.0% NH$_4$OH | 9.4 | 55.2 | 0 |

Example 2

$C_4F_9SO_2N(H)CH_2CH_2OH$ with Tetramethyl Ammonium Hydroxide

25% solutions of N-HFBSE were prepared by dissolving molten N-HFBSE in aqueous tetramethyl ammonium (TMAH, 25% in water available from Alfa Aesar, Ward Hill, Mass.) which had been diluted with 18.2 megaohm water. The solutions were mixed for one hour, allowed to settle overnight and then filtered through a 0.45 μm polytetrafluoroethylene (PTFE) syringe filter. Examples 8-14 were prepared according to Table 3 below.

TABLE 3

Sample Preparation of N-HFBSE/TMAH

| Example | Wt % TMAH | Mass Water (g) | Mass 25% TMAH (g) | Mass N-HFBSE (g) |
|---|---|---|---|---|
| 8 | 2.1% TMAH | 13.31 | 1.69 | 4.99 |
| 9 | 3.2% TMAH | 12.46 | 2.58 | 5.02 |
| 10 | 4.2% TMAH | 11.22 | 3.37 | 5.15 |
| 11 | 5.3% TMAH | 10.77 | 4.21 | 5.05 |
| 12 | 6.3% TMAH | 9.93 | 5.08 | 4.99 |
| 13 | 8.5% TMAH | 8.23 | 6.76 | 5.02 |
| 14 | 10.6% TMAH | 6.54 | 8.47 | 5.01 |

These solutions were further diluted with water to 2000 ppm surfactant (N-HFBSE) for surface tension and adsorption testing. The surface tension and frequency shift of Examples 8-14 are reported in Table 4 below.

TABLE 4

N-HFBSE/TMAH at 2000 ppm

| Example | Sample | pH | Surface Tension (dyn/cm) | Frequency Shift |
|---|---|---|---|---|
| 8 | 2.1% TMAH | 6.7 | 20.3 | 12 |
| 9 | 3.2% TMAH | 7.0 | 22.5 | 9 |
| 10 | 4.2% TMAH | 7.2 | 25.5 | 8 |
| 11 | 5.3% TMAH | 7.6 | 30.8 | |
| 12 | 6.3% TMAH | 8.3 | 40.5 | 4 |
| 13 | 8.5% TMAH | 11.2 | 58.1 | 3 |
| 14 | 10.6% TMAH | 11.5 | 56.8 | 3 |

Example 3

$C_4F_9SO_2NH_2$ with Ammonium Hydroxide $C_4F_9SO_2NH_2$ (N-HFBSA) was prepared according to U.S. Pat. No. 6,890,452. 25% solutions of N-HFBSA were prepared by dissolving molten N-HFBSA in aqueous ammonia which had been diluted with 18.2 megaohm water. The solutions were mixed for one hour, allowed to settle overnight and then filtered through a 0.45 μm polytetrafluoroethylene (PTFE) syringe filter. Examples 15-20 were prepared according to Table 5 below.

TABLE 5

Sample Preparation of N-HFBSA/NH$_4$OH

| Example | Wt % NH$_4$OH | Mass Water (g) | Mass 29% NH$_3$ (g) | Mass N-HFBSA (g) |
|---|---|---|---|---|
| 15 | 1.5% NH$_4$OH | 14.50 | 0.50 | 5.01 |
| 16 | 2.0% NH$_4$OH | 14.33 | 0.68 | 5.04 |
| 17 | 2.5% NH$_4$OH | 14.16 | 0.84 | 5.00 |
| 18 | 3.0% NH$_4$OH | 14.00 | 1.01 | 5.00 |
| 19 | 4.0% NH$_4$OH | 13.65 | 1.34 | 5.00 |
| 20 | 5.0% NH$_4$OH | 13.32 | 1.68 | 5.01 |

These solutions were further diluted with water to 2000 ppm surfactant (N-HFBSA) for surface tension and adsorption testing. The surface tension and frequency shift are reported in Table 6 below.

TABLE 6

N-HFBSA/NH$_4$OH at 2000 ppm

| Example | Sample | pH | Surface Tension (dyn/cm) | Frequency Shift |
|---|---|---|---|---|
| 15 | 1.5% NH$_4$OH | 6.1 | 36.4 | 6 |
| 16 | 2.0% NH$_4$OH | 6.4 | 39.5 | 4 |
| 17 | 2.5% NH$_4$OH | 6.8 | 43.3 | 4 |
| 18 | 3.0% NH$_4$OH | 7.3 | 49.6 | 3 |
| 19 | 4.0% NH$_4$OH | 8.6 | 59.2 | 3 |
| 20 | 5.0% NH$_4$OH | 8.9 | 58.3 | 3 |

Example 4

C$_4$F$_9$SO$_2$NH$_2$ with Tetramethyl Ammonium Hydroxide

A 25% solution of N-HFBSA was prepared by dissolving 2.50 g of molten N-HFBSA in 6.086 g of tetramethyl ammonium and 1.412 g of 18.2 megaohm water. The solution was mixed for one hour, allowed to settle overnight and then filtered through a 0.45 μm polytetrafluoroethylene (PTFE) syringe filter.

A solution of dilute nitric acid was prepared by adding 0.62 g of 70% nitric acid to 60.41 g 18.2 megaohm water. The N-HFBSA/TMAH solution was diluted with water to 2000 ppm surfactant (N-HFBSA) with 18.2 megaohm water and the dilute nitric acid to vary the pH of the resulting solutions. These solutions were analyzed for surface tension and adsorption testing. The surface tension and frequency shift are reported in Table 7 below.

TABLE 7

N-HFBSA/TMAH at 2000 ppm

| Example | pH | Surface Tension (dyn/cm) | Frequency Shift |
|---|---|---|---|
| 21 | 5.7 | 32.9 | 7 |
| 22 | 6.2 | 36.8 | 5 |
| 23 | 6.9 | 44.5 | 3 |
| 24 | 11.0 | 65.0 | 2 |
| 25 | 11.4 | 65.1 | 2 |
| 26 | 11.7 | 65.2 | 3 |

Example 5

C$_4$F$_9$SO$_2$N(H)CH$_3$ with Tetramethyl Ammonium Hydroxide

C$_4$F$_9$SO$_2$N(H)CH$_3$ was prepared according to WO2001/30873. 25% solutions of C$_4$F$_9$SO$_2$N(H)CH$_3$ were prepared by dissolving molten C$_4$F$_9$SO$_2$N(H)CH$_3$ in aqueous tetramethyl ammonium which had been diluted with 18.2 megaohm water. The solutions were mixed for one hour, allowed to settle overnight and then filtered through a 0.45 μm polytetrafluoroethylene (PTFE) syringe filter. Examples 27-30 were prepared according to Table 8 below.

TABLE 8

Sample Preparation of C$_4$F$_9$SO$_2$N(H)CH$_3$/TMAH

| Example | Wt % TMAH | Mass Water (g) | Mass 25% TMAH (g) | Mass C$_4$F$_9$SO$_2$N(H)CH$_3$ (g) |
|---|---|---|---|---|
| 27 | 5.8% TMAH | 2.070 | 0.925 | 1.011 |
| 28 | 6.9% TMAH | 1.889 | 1.118 | 0.998 |
| 29 | 9.3% TMAH | 1.522 | 1.491 | 0.994 |
| 30 | 11.6% TMAH | 1.147 | 1.857 | 1.003 |

These solutions were further diluted with water to 2000 ppm surfactant (C$_4$F$_9$SO$_2$N(H)CH$_3$) for surface tension and adsorption testing. The surface tension and frequency shift are reported in Table 9 below.

TABLE 9

C$_4$F$_9$SO$_2$N(H)CH$_3$/TMAH at 2000 ppm

| Example | Sample | pH | Surface Tension (dyn/cm) | Frequency Shift |
|---|---|---|---|---|
| 27 | 5.8% TMAH | 8.1 | 30.7 | 17 |
| 28 | 6.9% TMAH | 8.9 | 39.7 | 3 |
| 29 | 9.3% TMAH | 11.2 | 47.0 | 3 |
| 30 | 11.6% TMAH | 11.5 | 45.1 | 3 |

Comparative Example 1

C$_3$F$_7$CO$_2$H with Ammonium Hydroxide

C$_3$F$_7$CO$_2$H was prepared according to U.S. Pat. No. 2,567,011. 25% solutions of C$_3$F$_7$CO$_2$H were prepared by dissolving C$_3$F$_7$CO$_2$H in aqueous ammonia which had been diluted with 18.2 megaohm water. The solutions were mixed for one hour, allowed to settle overnight and then filtered through a 0.45 μm polytetrafluoroethylene (PTFE) syringe filter. Examples 31-34 were prepared according to Table 10 below.

TABLE 10

Sample Preparation of C$_3$F$_7$CO$_2$H/NH$_4$OH

| Example | Wgt. % NH$_4$OH | Mass Water (g) | Mass 29% NH$_3$ (g) | Mass C$_3$F$_7$CO$_2$H (g) |
|---|---|---|---|---|
| 31 | 2.1% NH$_4$OH | 7.159 | 0.347 | 2.499 |
| 32 | 4.1% NH$_4$OH | 6.820 | 0.678 | 2.499 |
| 33 | 7.6% NH$_4$OH | 6.471 | 1.032 | 2.498 |
| 34 | 8.2% NH$_4$OH | 6.132 | 1.371 | 2.500 |

These solutions were further diluted with water to 2000 ppm surfactant ($C_3F_7CO_2H$) for surface tension and adsorption testing. The surface tension and frequency shift are reported in Table 11 below.

TABLE 11

$C_3F_7CO_2H/NH_4OH$ at 2000 ppm

| Example | Sample | pH | Surface Tension (dyn/cm) | Frequency Shift |
|---|---|---|---|---|
| 31 | 2.1% $NH_4OH$ | 2.4 | 70.5 | 3 |
| 32 | 4.1% $NH_4OH$ | 3.2 | 70.7 | 1 |
| 33 | 7.6% $NH_4OH$ | 9.0 | 69.9 | 1 |
| 34 | 8.2% $NH_4OH$ | 9.3 | 70.5 | 1 |

Although the present invention has been described with reference to preferred embodiments, workers skilled in the art will recognize that changes may be made in form and detail without departing from the spirit and scope of the invention.

The invention claimed is:

1. A method of modifying a surface of a photoresist material comprising:
   exposing the photoresist material to a developer solution comprising tetramethyl ammonium hydroxide, thereby generating a patterned photoresist material that is susceptible to pattern collapse cause by unbalanced capillary forces acting between pattern features; and thereafter,
   exposing the photoresist material to an aqueous ionic surfactant rinse solution comprising a perfluoroalkyl sulfonamide having Formula I:

$$R_fSO_2NH\text{—}R' \quad (I)$$

where $R_f\text{=}C_nF_{2n+1}$— and n=1 to 6, R'=—H, —$CH_3$, or —$CH_2CH_2OH$; and
   varying the pH of the aqueous ionic surfactant solution until a fluorochemical layer is formed in or on the photoresist material;
   wherein the aqueous ionic surfactant solution has a pH of within about 3 pH units of a pKa of the perfluoroalkyl sulfonamide.

2. The method of claim 1, wherein the aqueous ionic surfactant solution has a pH of within about 2 pH units of the pKa of the perfluoroalkyl sulfonamide.

3. The method of claim 1, wherein varying the pH of the aqueous ionic surfactant solution comprises substantially no melting of the photoresist material.

4. The method of claim 1, wherein varying the pH of the aqueous ionic surfactant solution comprises forming substantially no deformities on the photoresist material.

5. The method of claim 1, wherein the aqueous ionic surfactant solution has a concentration of between about 10 ppm and about 10,000 ppm.

6. The method of claim 5, wherein the aqueous ionic surfactant solution has a concentration of between about 50 ppm and about 5,000 ppm.

7. The method of claim 1, wherein the aqueous ionic surfactant solution has a neutral sulfonamide to sulfonamide salt ratio of between about 99.9:0.1 and about 0.1:99.9.

8. The method of claim 1, further comprising drying the photoresist material to remove the aqueous ionic surfactant solution.

9. The method of claim 1, further comprising rinsing the photoresist material with deionized water.

10. The method of claim 1, wherein n=4.

11. The method of claim 1, wherein the aqueous ionic surfactant solution is selected from the group consisting of: $C_4F_9SO_2N(H)CH_2CH_2OH$, $C_4F_9SO_2NH_2$, and $C_4F_9SO_2N(H)CH_3$.

12. The method of claim 1, wherein the photoresist is a patterned photoresist.

* * * * *